United States Patent [19]

Lewis

[11] Patent Number: 4,626,782

[45] Date of Patent: Dec. 2, 1986

[54] MAGNETOMETER OPERATED AT A SELF-RESONANT FREQUENCY BY A SENSE WINDING

[75] Inventor: Richard W. Lewis, Derby, Kans.

[73] Assignee: The Boeing Company, Seattle, Wash.

[21] Appl. No.: 535,408

[22] Filed: Sep. 26, 1983

[51] Int. Cl.⁴ ............................................. G01R 33/04
[52] U.S. Cl. ........................................ 324/253; 33/361
[58] Field of Search ............................ 324/253–255, 324/260, 117 R; 33/361; 340/870.33

[56] References Cited

U.S. PATENT DOCUMENTS

| | | | |
|---|---|---|---|
| 2,480,265 | 8/1949 | Rubenstein | 324/253 |
| 2,565,799 | 8/1951 | Brattain | 324/253 |
| 2,861,242 | 11/1958 | Leavitt | 324/254 |
| 3,001,129 | 9/1961 | Knowles | 324/253 |
| 3,040,247 | 6/1962 | Van Allen | 324/253 |
| 3,286,169 | 11/1966 | Slonczewski | 324/254 |
| 3,427,534 | 2/1969 | Maxwell | 324/117 R X |
| 3,626,280 | 12/1971 | Van Englehoven et al. | 324/253 |
| 4,447,776 | 5/1984 | Brown | 324/253 |

FOREIGN PATENT DOCUMENTS

| | | | |
|---|---|---|---|
| 0060370 | 10/1979 | Japan | 324/254 |
| 0308391 | 8/1971 | U.S.S.R. | 324/253 |
| 0393704 | 12/1973 | U.S.S.R. | 324/253 |

*Primary Examiner*—Gerard R. Strecker

[57] ABSTRACT

A self-resonant magnetometer using the inductance and interwinding capacitance of a sense winding to establish the frequency of operation. A sense winding signal is amplified to provide a driver current for a driver winding. The driver winding current with the addition of a dc offset current causes the mu (permeability) of a ferrite core to vary in a non-linear region of its B/H curve. The change in the mu of the ferrite core produces a change in flux in the magnetic core if an external magnetic field is present. This change in flux induces a signal in the sense winding.

2 Claims, 6 Drawing Figures

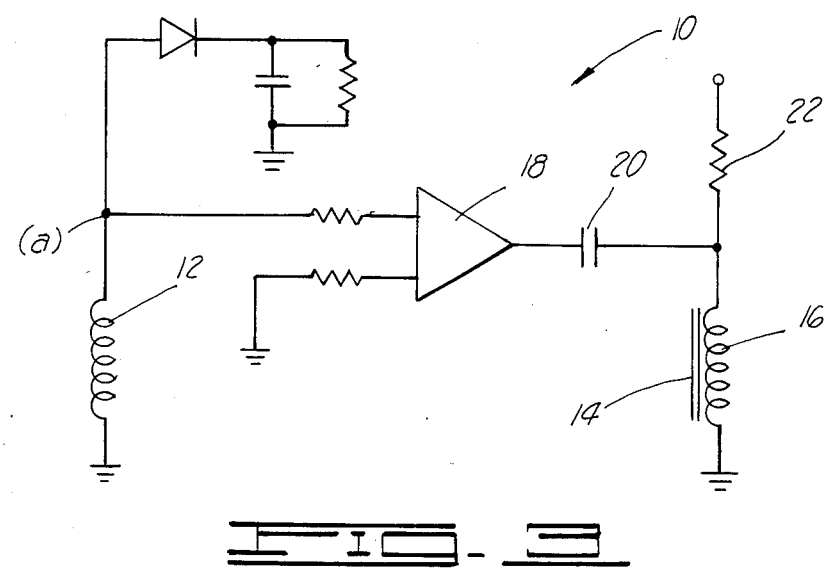
FIG-3
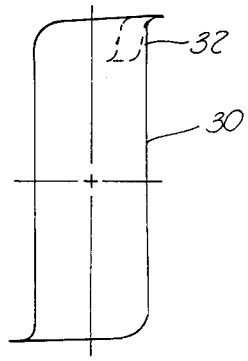
FIG-4
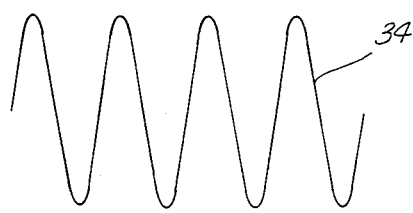
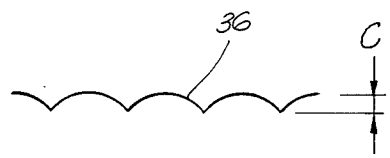
FIG-5    FIG-6

MAGNETOMETER OPERATED AT A SELF-RESONANT FREQUENCY BY A SENSE WINDING

BACKGROUND OF THE INVENTION

This invention relates to an improved magnetometer and more particularly but not by way of limitation to a self-resonant magnetometer for effectively sensing an external magnetic field.

Heretofore, one of the major noise problems in magnetic heading sensors was the ringing (oscillation) of the sense winding at its self-resonant frequency. In a second-harmonic type of magnetic sensor the sense winding oscillation produces a noise signal which is difficult to remove by filtering. The use of a digital driver and sensing techniques reduces this noise level by properly controlling the rise time of the driver signal.

This noise source was essentially eliminated when the drive circuit was operated at the self-resonant frequency of the sense winding. The sense winding signal is increased by its Q (its inductive reactance divided by its resistance). It was initially thought it would be impractical to design a circuit which would generate a stable sense winding frequency at its own resonance under all operational conditions. Each unit would have to be matched for the individual core characteristics which would also change with temperature. The above mentioned problems were eliminated by the subject invention.

In U.S. Pat. Nos. 2,480,265, 3,040,247, 2,565,799 and 3,626,280 various types of external magnetic fields are described having methods of biasing the magnetic core near saturation and methods of improving the accuracy using second-harmonic sensing. None of the above mentioned patents particularly point out the advantages, unique features and combinations of structure provided by the subject invention as described herein.

SUMMARY OF THE INVENTION

The magnetometer is made up of a driver winding, a sense winding, a toroidal ferrite core, amplifier and demodulator. A driver winding is wound on the core and a sense winding is wound over the core and drive winding in such a manner that no signal is induced into the sense winding by the driver winding signal. A signal is induced into the sense winding by the component of the external magnetic field parallel to the sense winding axis due to the changing permeability of the ferrite core. This signal produces the ringing of the sense winding at its self-resonant frequency when the amplifier loop gain is greater than one and in phase with the resonant frequency. The demodulated signal is proportional to the strength of the magnetic field.

The subject invention uses the inductance and interwinding capacitance of the sense winding to establish the frequency of operation of the magnetometer. A driver winding signal changes the core permeability. The changing permeability of the core induces a signal into the sense winding if an external magnetic field is present. This signal is in phase with the self-resonant oscillation of the sense winding. By having a loop gain greater than one the oscillation will continue. The noise produced by the ringing frequency is essentially eliminated by the use of the ringing frequency as the frequency of operation.

The advantages and objects of the invention will become evident from the following detailed description of the drawings when read in connection with the accompanying drawings which illustrates preferred embodiments of the invention.

BRIEF DESCRIPTION OF THE DRAWINGS

FIG. 3 is a schematic drawing showing of the self-resonant magnetometer.

FIG. 4 is a standard B/H curve for a ferrite material.

FIGS. 5 and 6 are graphical representations of the signals at the sense and driver windings, respectively.

DETAILED DESCRIPTION OF THE DRAWINGS

Figure 1:
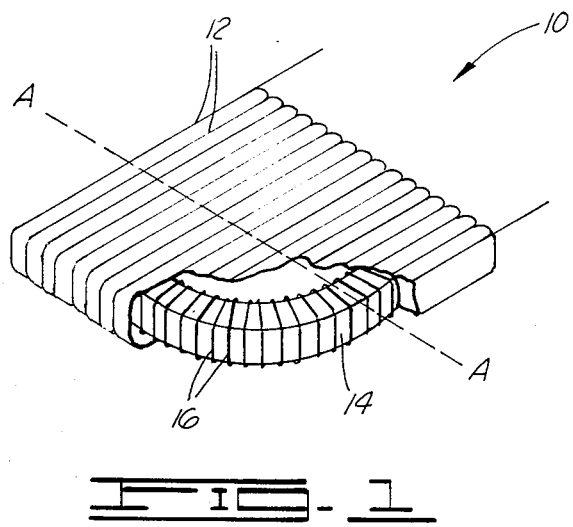
FIG. 1 is a perspective view of the self-resonant magnetometer.

In FIG. 1 the self-resonant magnetometer is designated by general reference numeral 10. The magnetometer 10 includes a driver winding 16 which is wound on the ferrite core 14. The magnetometer 10 includes a sense winding 12 which is overwound over the ferrite core 14 and driver winding 16. The driver winding 16 current magnetizes the ferrite core 14 but does not induce a signal into the sense winding 12 because there is no mutual coupling between the driver winding 16 and the sense winding 12. The ferrite core 14 permeability is changed by the driver winding 16 current and if an external magnetic field is present with a component parallel to the sense winding 12 axis, indicated by line A—A, then a voltage will be induced into the sense winding 12. This voltage is produced by the flux change $d\phi/dt$ in the ferrite core 14.

It should be noted that as the ferrite core approaches saturation its permeability changes rapidly producing a large change in the flux field within the core 14 due to an external magnetic field. This change in flux produces a signal in the sense winding 12 which is proportional to the external magnetic field component parallel to the sense winding 16 axis.

Figure 2:
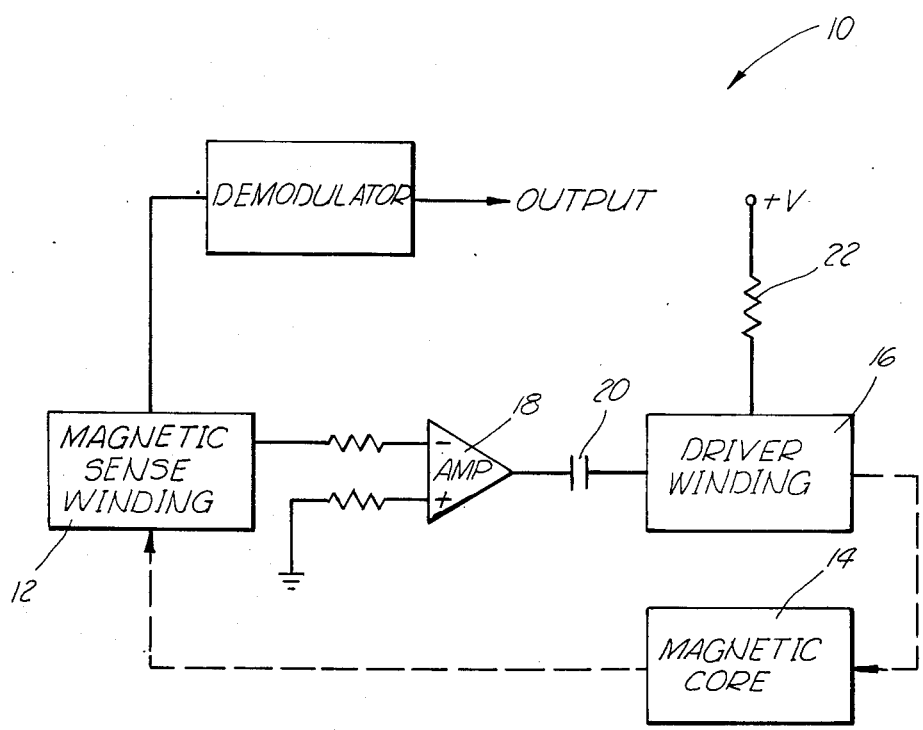
FIG. 2 is a block diagram of one type of circuit for driving the magnetometer shown in FIG. 1.

In FIG. 2 a block diagram illustrates one method of driving the ferrite core 14 at the self-resonant frequency of the sense winding 12. The sense winding 12 output is detected by a demodulator and also separately amplified by an operational amplifier 18 and this amplified signal is coupled through a dc blocking capacitor 20 and into the driver winding 16. The driver winding 16 is biased by resistor 22 to provide a current which will bring the ferrite core 14 near its saturation level. A small additional current from the operational amplifier 18 will drive the ferrite core 14 in this non-linear region near saturation, changing its permeability rapidly. The sense winding 12 signal level is determined by the component of the external magnetic field parallel to the sense winding 12 axis while the ferrite core 14 permeability is changing. The level of this signal will be proportional to that external field component.

In FIG. 3 a schematic of the magnetometer 10 is shown to implement the desired functions of driving the driver winding 16, for sensing a component of the external flux field by the sense winding 12. Note the ferrite core 14 is not shown between the driver winding 16 and the sense winding 12 because mutual coupling is essentially eliminated. The resistor 22 is set at such a value that the ferrite core 14 permeability will be in the non-linear region near its saturation value. Amplifier 18 inverts the signal present at node (a) to provide positive feedback from the sense winding 12 signal.

In FIG. 4 a B/H curve 30 is shown for a ferrite material. The superimposed curved 32 is shown near the saturation value where this magnetometer 10 will operate.

FIG. 5 shows a signal output of the sense winding. The signal is a sinusoidal wave 34 with little distortion because of the Q of the sense winding 12 and the loose coupling to the output of the amplifier 20. The amplitude of the signal is much larger that one might produce with a standard flux detector technique.

FIG. 6 shows a driver winding signal 36 which is an offset dc signal composed of the offset bias current through resistor 22 and the amplified signal through capacitor 20. The dc amplitude of signal 36 ranged from 2.5 to 3.0 volts while the change in voltage (c) is only about 0.2 volts.

The subject invention as described above provides an improved magnetometer. The signal to noise level is reduced by using the sense winding ringing frequency as the operational frequency of the magnetometer. The circuit also reduces the critical aspects to provide for variations in the core material, temperature, and winding capacitance and inductance.

Changes may be made in the construction and arrangement of the parts or elements of the embodiments as described herein without departing from the spirt or scope of the invention defined in the following claims.

What is claimed is:

1. A self resonant magnetometer for effectively measuring an external magnetic field and eliminating ringing noise normally associated with a magnetometer when an external signal is received, the magnetometer comprising:

a ferrite core;

a driver winding wound on the ferrite core for magnetizing the core in its non-linear region near its saturation level;

a voltage source connected to a resistor, the resistor connected to and biasing the driver winding and providing a current which will bring the permeability of the ferrite core near its saturation level;

a sense winding wound over the core and the driver winding, through interwire capacitance inherent in the sense winding the sense winding is designed to operate at a self-resonant frequency, this frequency is the same as the operating frequency of the magnetometer for eliminating noise related therewith;

an operational amplifier having its input connected to the sense winding and its output coupled to a dc blocking capacitor, the capacitor connected to the driver winding; and an output signal detector via a lead connected to the sense winding for receiving a signal therefrom, the signal proportioned to the external magnetic field sensed by the sense winding;

the sense winding indirectly connected to the driver winding via the amplifer and capacitor, any additional current, as sensed by the sense winding due to the external field, is amplified by the amplifier to the capacitor to the driver winding for driving the core into its non-linear region near saturation thereby changing the permeability rapidly and at the same time the sense winding providing the output signal during the permeability change.

2. The magnetometer as described in claim 1 wherein the ferrite core is a toroidal core with the driver winding wound thereon.

* * * * *